United States Patent
Berman

(10) Patent No.: US 11,573,715 B2
(45) Date of Patent: Feb. 7, 2023

(54) MEMORY CELL LEVEL ASSIGNMENT USING OPTIMAL LEVEL PERMUTATIONS IN A NON-VOLATILE MEMORY

(71) Applicant: SAMSUNG ELECTRONICS CO., LTD., Suwon-si (KR)

(72) Inventor: Amit Berman, Haifa (IL)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 52 days.

(21) Appl. No.: 17/188,731

(22) Filed: Mar. 1, 2021

(65) Prior Publication Data

US 2022/0276796 A1    Sep. 1, 2022

(51) Int. Cl.

| G06F 12/00 | (2006.01) |
| G06F 3/06 | (2006.01) |
| G11C 16/04 | (2006.01) |
| G11C 16/10 | (2006.01) |
| G11C 16/14 | (2006.01) |
| G06F 11/07 | (2006.01) |
| G11C 11/56 | (2006.01) |

(52) U.S. Cl.
CPC .......... *G06F 3/0632* (2013.01); *G06F 3/0604* (2013.01); *G06F 3/0659* (2013.01); *G06F 3/0673* (2013.01); *G06F 11/076* (2013.01); *G06F 11/0727* (2013.01); *G11C 16/0483* (2013.01); *G11C 16/10* (2013.01); *G11C 16/14* (2013.01); *G11C 11/5671* (2013.01)

(58) Field of Classification Search
None
See application file for complete search history.

(56) References Cited

U.S. PATENT DOCUMENTS

| 2015/0324148 A1* | 11/2015 | Achtenberg | G11C 16/349 |
| | | | 711/103 |
| 2019/0258423 A1* | 8/2019 | Rozman | G06F 11/0727 |

* cited by examiner

*Primary Examiner* — Daniel D Tsui
(74) *Attorney, Agent, or Firm* — F. Chau & Associates, LLC

(57) ABSTRACT

A memory system includes a memory device and a memory controller. The memory device includes a plurality of memory cells. The memory controller is configured to manage the memory device using a cell level assignment with respect to a plurality of memory cell levels, determine a cell count for each of the cell levels associated with original data of the memory device that is to be accessed, predict an error rate from the cell counts, and selectively adjust the cell level assignment based on the error rate.

18 Claims, 14 Drawing Sheets

FIG. 7A

Level permutation for 4-Level Cells

Input: cell-count per level $N_1, N_2, N_3, N_4$ (1) $\{M_1, M_2\} \leftarrow$ the two highest counts from $\{N_1, N_2, N_3, N_4\}$
(2) Select case $\{M_1, M_2\}$:
(3) $\{1,2\}$ – invert LSB/MSB data
(4) $\{0,1\}$ – switch LSB/MSB logical to physical mapping.
(5) $\{1,2\}$ – invert LSB/MSB data
(6) $\{2,3\}$ – invert LSB/MSB data and switch logical to physical address mapping.
(7) $\{0,2\}$ – invert LSB pages in indices where MSB is 1
(8) $\{1,3\}$ – invert LSB pages in indices where MSB is 0
(9) End case

FIG. 11B

MEMORY CELL LEVEL ASSIGNMENT USING OPTIMAL LEVEL PERMUTATIONS IN A NON-VOLATILE MEMORY

TECHNICAL FIELD

Exemplary embodiments of the present inventive concept relate to level assignment in a non-volatile memory.

DISCUSSION OF RELATED ART

Modern NAND flash memory devices allow for several bits of data to be stored in each memory cell, providing improvements in manufacturing costs and performance. A memory cell in which multiple bits of data are stored may be referred to as a multi-level memory cell (MLC). A multi-level memory cell partitions a threshold voltage range of a memory cell into several voltage states, and data values written to the memory cell are extracted using the memory cell voltage levels.

However, the aggressive scaling and the growing number of bits per cell of a multi-level NAND flash memory results in higher error rates. Error correction codes are required to handle more errors, yet with less circuit area and power consumption. Thus, there is a need for low-complexity high-efficient error reduction methods.

SUMMARY

According to an exemplary embodiment of the inventive concept a memory system is provided. The memory system includes a memory device and a memory controller. The memory device includes a plurality of memory cells. The memory controller is configured to manage the memory device using a cell level assignment with respect to a plurality of memory cell levels, determine a cell count for each of the cell levels associated with original data of the memory device that is to be accessed, predict an error rate from the cell counts, and selectively adjust the cell level assignment based on the error rate.

According to an exemplary embodiment of the inventive concept a computer-implemented method for programming data to a memory system is provided. The memory system includes a memory device and a memory controller. The method includes: the memory controller receiving a write request including write data, determining cell counts of each of a plurality of cell levels based on the write data, determining two of the cell levels having a highest cell count from the determined cell counts, determining one of a plurality of permutations of the cell levels that has a lowest error rate from the determined two cell levels, and writing the write data to the memory device according to the determined one permutation.

According to an exemplary embodiment of the inventive concept, a computer-implemented method for reading data from a memory system is provided. The memory system includes a memory device and a memory controller. The method includes: the memory controller receiving a read request including a read address from a host device, reading information associated with the read address indicating one of a plurality of permutations of memory cell levels, reading read data from the memory device corresponding to the read address using the indicated permutation, and outputting the read data to the host device.

BRIEF DESCRIPTION OF THE DRAWINGS

The above and other features of the present inventive concept will become more apparent by describing in detail exemplary embodiments thereof with reference to the accompanying drawings, in which:

FIGS. 11A and 11B illustrate exemplary level permutations that may be used in the method of FIG. 10.

DETAILED DESCRIPTION

Figure 1:
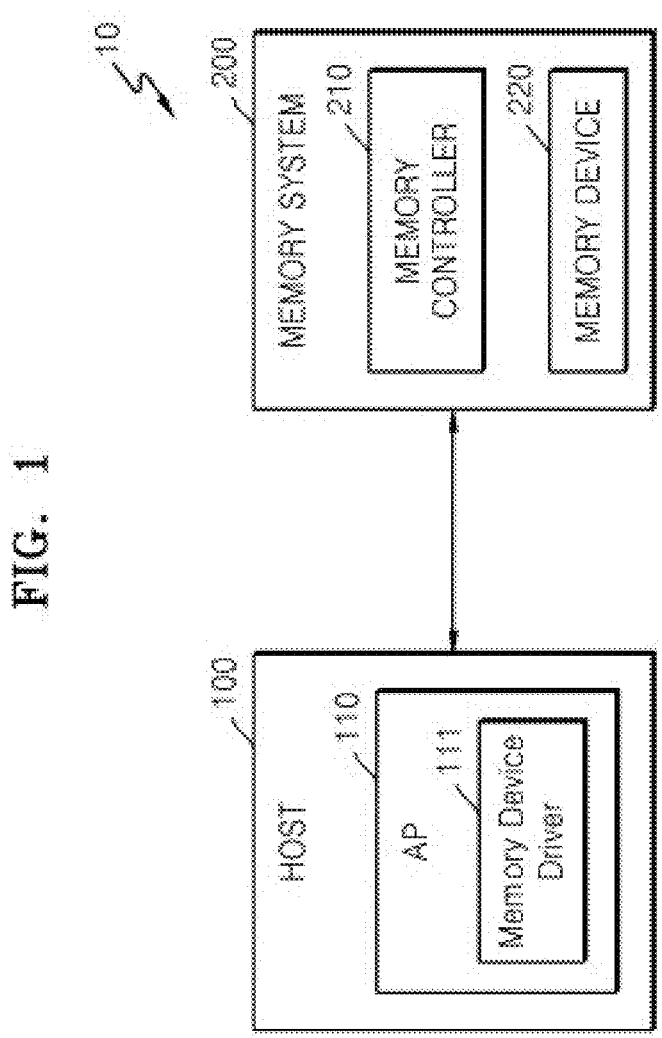
FIG. 1 is a block diagram illustrating an implementation of a data processing system including a memory system, according to an exemplary embodiment of the inventive concept.

Exemplary embodiments of the present inventive concept will be described more fully hereinafter with reference to the accompanying drawings. Like reference numerals may refer to like elements throughout the accompanying drawings.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a block diagram illustrating an implementation of a data processing system including a memory system, according to an exemplary embodiment of the inventive concept.

Referring to FIG. 1, the data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, exemplary embodiments of the inventive concept will be described as including a memory device that is a non-volatile memory. However, exemplary embodiments are not limited thereto. For example, the memory system 200 may include a memory device that is a volatile memory.

According to exemplary embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device. Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) mounted on, for example, a mobile device, or a central processing unit (CPU) included in a computer system.

As described above, the host 100 may include an AP 110. The AP 110 may include various intellectual property (IP) blocks. For example, the AP 110 may include a memory device driver 111 that controls the non-volatile memory system 200. The host 100 may communicate with the non-volatile memory system 200 to transmit a command (e.g., a read command, a write command, an erase command, etc.) related to a memory operation and receive a confirm command in response to the transmitted command.

The non-volatile memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command, or may provide read data to the memory controller 210 in response to the internal command.

Figure 4:
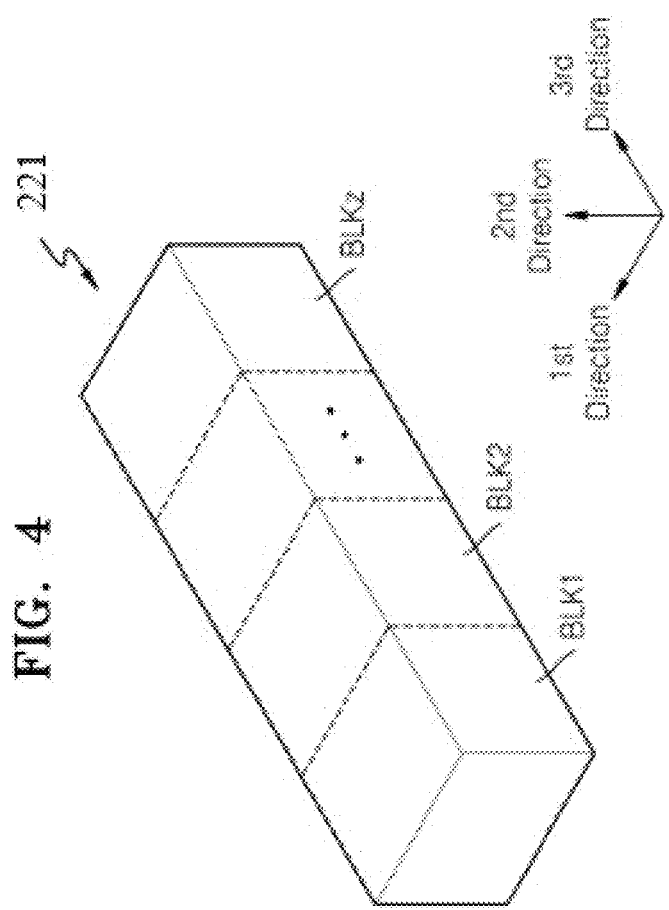
FIG. 4 is a block diagram of the memory cell array of FIG. 2, according to an exemplary embodiment of the inventive concept.

The memory device 220 may include a memory cell array that retains data stored therein, even when the memory device 220 is not powered on. The memory cell array may include as memory cells, for example, a NAND or NOR flash memory, a magnetoresistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
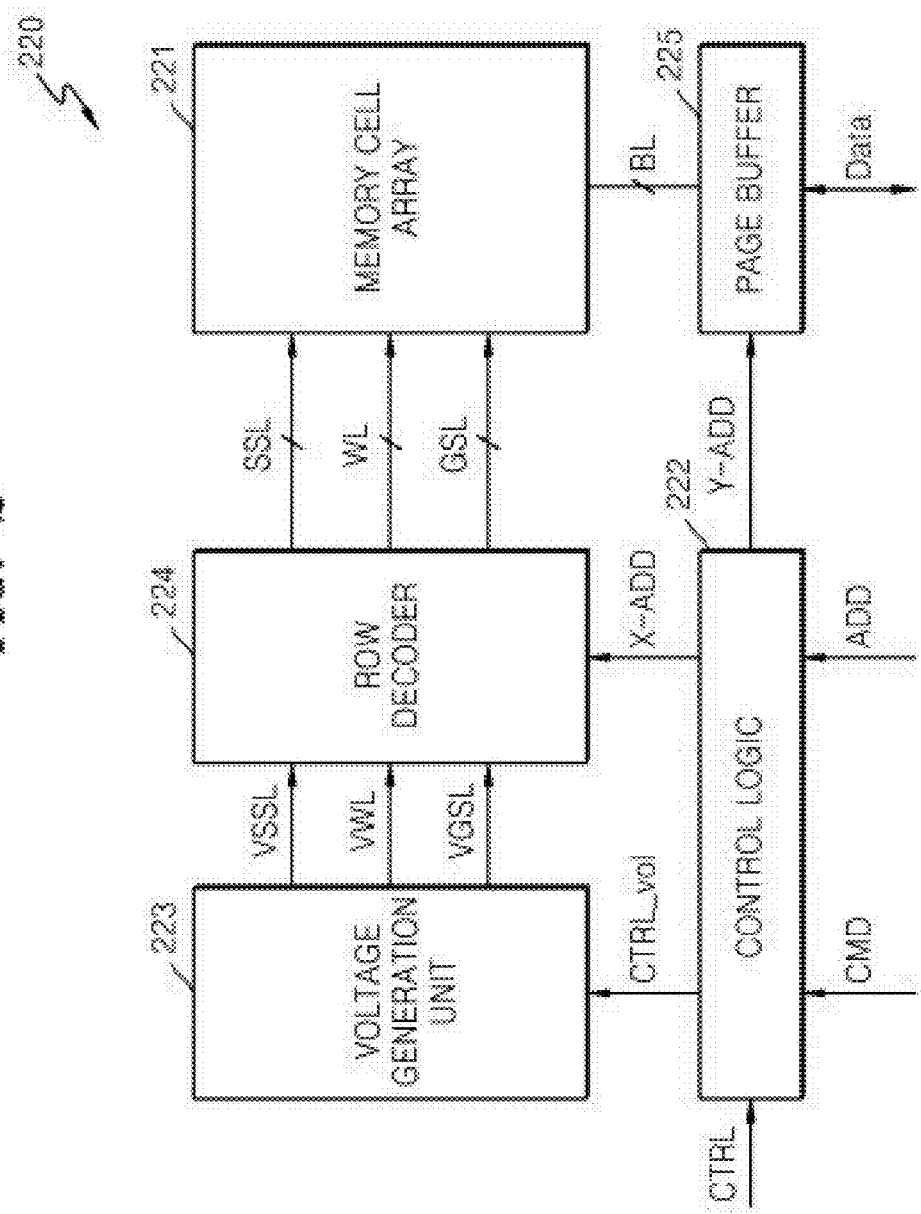
FIG. 2 is a detailed block diagram of a non-volatile memory device of FIG. 1, according to an exemplary embodiment of the inventive concept.

FIG. 2 is a detailed block diagram of the non-volatile memory device 220 of FIG. 1, according to an exemplary embodiment of the inventive concept.

Referring to FIG. 2, the non-volatile memory device 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the non-volatile memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an exemplary embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 3:
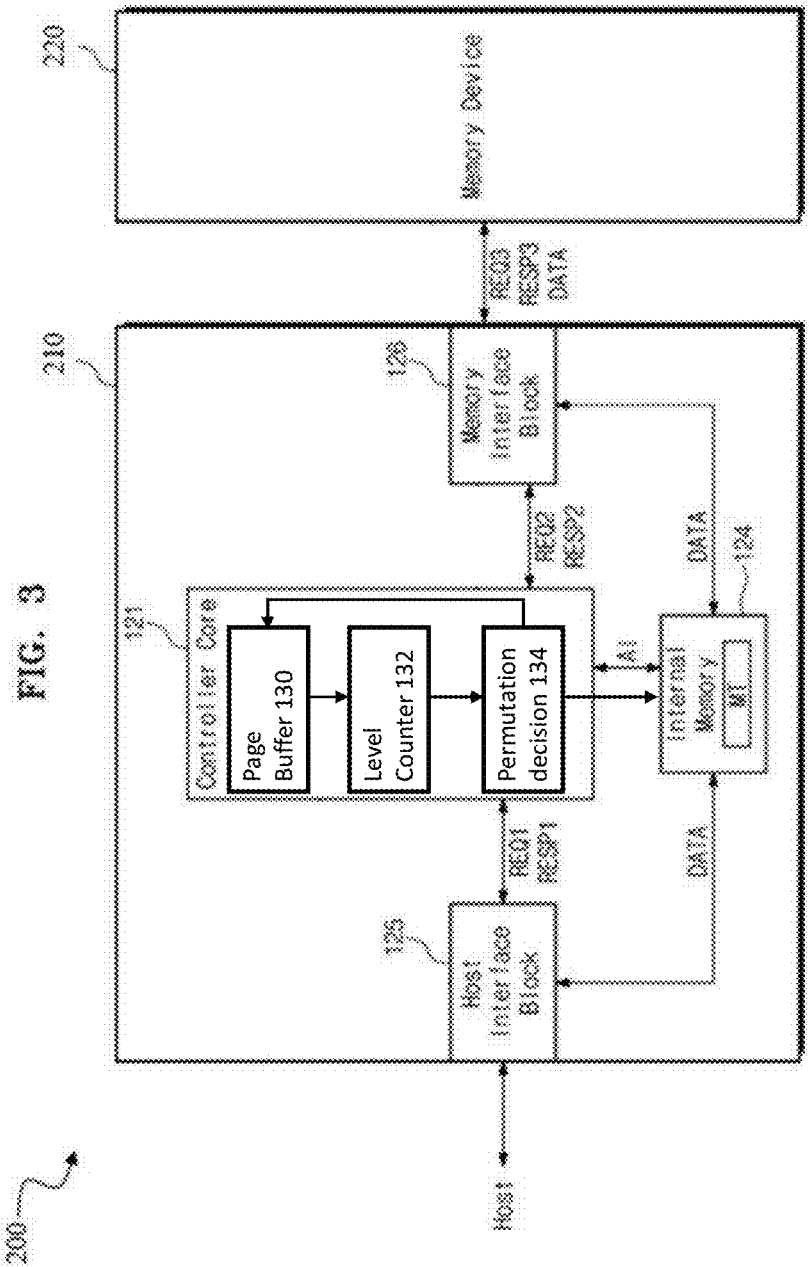
FIG. 3 is a block diagram illustrating the memory system of FIG. 1, according to an exemplary embodiment of the inventive concept.

FIG. 3 is a block diagram illustrating the memory system 200 of FIG. 1, according to an exemplary embodiment of the inventive concept.

Referring to FIG. 3, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 121, an internal memory 124, a host interface block 125, and a memory interface block 126.

The controller core 121 may include a page buffer 130, a level counter 132, and permutation decision logic 134 (e.g., a logic circuit and/or a processor). The controller core 121 may control and access the memory device 220 depending on a request received from the host 100 or an internally designated schedule. The controller core 121 may manage and execute various metadata and codes used to manage or operate the memory system 200. In an exemplary embodiment of the inventive concept, the controller core 121 includes an error correction code (ECC) circuit to perform error detection and correction on data read from memory cells of the memory device 220. For example, controller core 121 may sense read voltages from a subset of the memory cells in response to a read command and address information received from a Host, convert the read voltages into a codeword (including data and redundancy information), and perform an ECC operation on the codeword using the ECC circuit.

The controller core 121 may be used to execute a method for reducing errors during reading. The method is based on the difference in the number of cells at each charge distribution level prior to programming. A discrete level permutation is determined, so as to enlarge window margin and to pattern high and low distributions at the voltage-threshold axis.

According to an exemplary embodiment of the inventive concept, the controller core 121 determines a level assignment for a given page of the memory device 220 that is to be accessed, which is optimal for reducing errors if certain data were programmed to the given page, and accesses the page using the determined level assignment. In an embodiment, the controller core 121 determines the level assignment by analysing data for the page that is about to be written to the page. If it is determined that writing the data using the current level assignment will result in too many errors, the controller core 121 changes the level assignment from a normal level assignment to one of a plurality of compensated level assignments with less errors.

A level counter 132 of the controller core 121 counts the number of memory cells in a page of the memory device 220 having each level state that is to be written by data stored in a page buffer 130 of the controller core 121.

If the memory device 220 includes memory cells capable of storing 2-bit data, each memory cell can take on one of 4 states, namely an erase state (11), a first program state (10), a second program state (00), or a third program state (01). In this case, the level counter 132 would provide four counts, a first count of the number of memory cells in the page having the erase state or level, a second count of the number of memory cells in the page having the first program state or level, a third count of the number of memory cells in the page having the second program state or level, and a fourth count of the number memory cells in the page having the third program state or level.

If the memory device 220 includes memory cells capable of storing 4-bit data, each memory cell can take on one of 8 states, namely an erase state (111), a first program state (011), a second program state (001), a third program state (000), a fourth program state (010), a fifth program state (11), a sixth program state (100), or a seventh program state (101). In this case, the level counter 132 would provide eight counts, a first count of the number of memory cells in the page having the erase state or level, a second count of the number of memory cells in the page having the first program state or level, a third count of the number of memory cells in the page having the second program state or level, a fourth count of the number memory cells in the page having the third program state or level, a fifth count of the number memory cells in the page having the fourth program state or level, a sixth count of the number memory cells in the page having the fifth program state or level, a sixth count of the number memory cells in the page having the sixth program state or level, a seventh count of the number memory cells in the page having the seventh program state or level.

The permutation decision logic 134 then uses the highest of these counts (e.g., the highest two) to determine whether the level assignment needs to be changed from the normal level assignment to one of the compensated level assignments. If the level assignment does not need to be changed for the page that is to be written to a physical address of the memory device 220, then the controller core 121 writes the data of the page buffer 130 for the page to the physical address without change, and stores information for the physical address or a logical address associated with the physical address in the internal memory 124 indicating that no change was made. If the level assignment needs to be changed, the controller core 121 determines which one of the compensated level assignments would reduce anticipated errors most, performs a conversion on the data of the page according to the determined one compensated level assignment, writes the converted data to the memory device 220, and stores information in the internal memory 124 indicating the type of data conversion or the type of compensated level assignment. Later, when the Host device 100 wants to read the data back from the memory device 220, the controller core 121 determines whether the data was stored with or without conversion by checking the information stored in the internal memory 124 that is associated with the logical or physical address of the data. If the information indicates that no change was made, then the controller core 121 outputs the data as is to the Host Device 100 through the Host Interface block 125. If the information indicates that a change was made, then the controller core 121 performs a conversion on the data according to the type of change made, and outputs the converted data to the Host Device 100 through the Host Interface block 125.

The internal memory 124 may be used, for example, as a system memory which is used by the controller core 121, a cache memory which stores data of the memory device 220, or a buffer memory which temporarily stores data between the host 100 and the memory device 220. The internal memory 124 may additionally store a mapping table MT that indicates a relationship between logical addresses from the Host Device 100 assigned to the memory system 200 and physical addresses of the memory device 220. The internal memory 124 may include, for example, a dynamic random access memory (DRAM) or a static random access memory (SRAM). The internal memory 124 may be a buffer.

In an exemplary embodiment, a level assignment where two immediately adjacent levels both have a high cell count relative to the other levels is likely to have more errors than a level assignment where those two levels with high cell counts are kept as far apart from one another as possible. The determination of the level assignment will be discussed in more detail below with respect to FIGS. 6-11.

The host interface block 125 may include a component for communicating with the host 100 such as, for example, a physical block. The memory interface block 126 may include a component for communicating with the memory device 220 such as, for example, a physical block.

The host interface block 125 may provide the memory control core 122 with a first request REQ1 received from the host 100. The first request REQ1 may include a command (e.g., a read command or a write command) and a logical address. The memory control core 122 may translate the first request REQ1 to a second request REQ2 suitable for the memory device 220.

For example, the controller core 121 may translate a format of the command. The controller core 121 may obtain address information AI with reference to the mapping table MT stored in the internal memory 124. The controller core 121 may translate a logical address to a physical address of the memory device 220 by using the address information AI. The controller core 121 may provide the second request REQ2 suitable for the memory device 220 to the memory interface block 126.

The memory interface block 126 may register the second request REQ2 from the controller core 121 at a queue. The memory interface block 126 may transmit a request that is first registered at the queue to the memory device 220 as a third request REQ3.

When the first request REQ1 is a write request, the host interface block 125 may write data received from the host 100 to the internal memory 124. When the third request REQ3 is a write request, the memory interface block 126 may transmit data stored in the internal memory 124 to the memory device 220.

When data is completely written, the memory device 220 may transmit a third response RESP3 to the memory interface block 126. In response to the third response RESP3, the memory interface block 126 may provide the controller core 121 with a second response RESP2 indicating that the data is completely written.

After the data is stored in the internal memory 124 or after the second response RESP2 is received, the controller core 121 may transmit a first response RESP1 indicating that the request is completed to the host 100 through the host interface block 125.

When the first request REQ1 is a read request, the read request may be transmitted to the memory device 220 through the second request REQ2 and the third request REQ3. The memory interface block 126 may store data received from the memory device 220 in the internal memory 124. When data is completely transmitted, the memory device 220 may transmit the third response RESP3 to the memory interface block 126.

As the third response RESP3 is received, the memory interface block 126 may provide the controller core 121 with the second response RESP2 indicating that the data is completely stored. As the second response RESP2 is received, the controller core 121 may transmit the first response RESP1 to the host 100 through the host interface block 125.

The host interface block 125 may transmit data stored in the internal memory 124 to the host 100. In an exemplary embodiment, in the case in which data corresponding to the first request REQ1 is stored in the internal memory 124, the transmission of the second request REQ2 and the third request REQ3 may be omitted.

Figure 5:
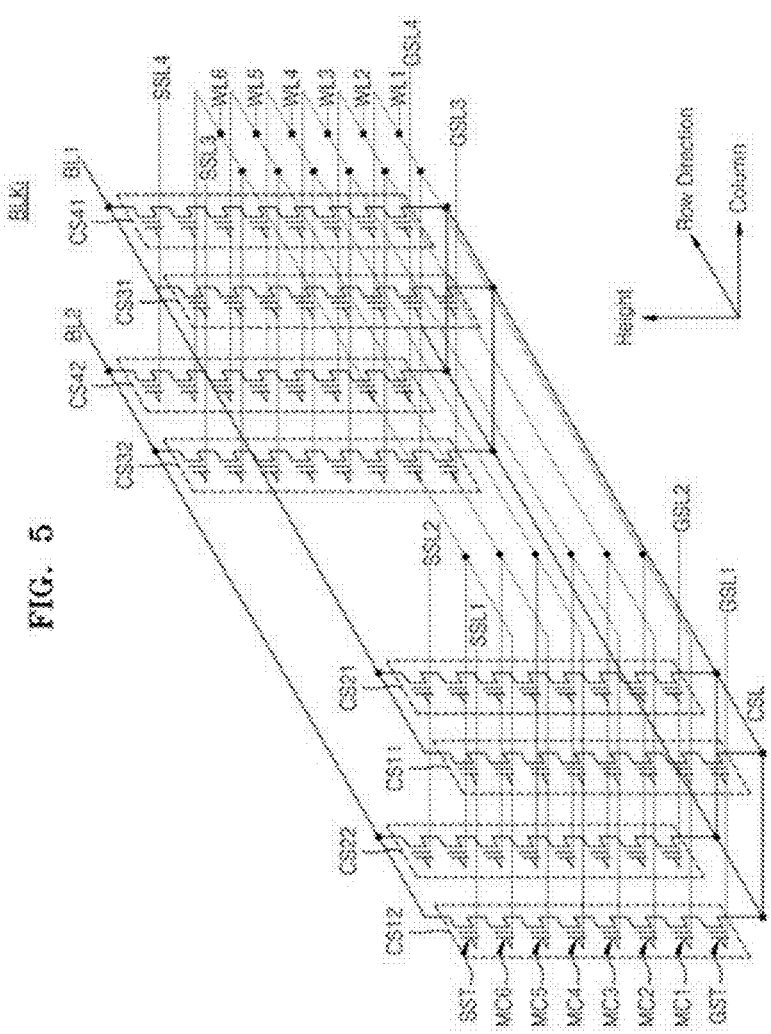
FIG. 5 is a circuit diagram of a memory block of the memory cell array of FIG. 4, according to an exemplary embodiment of the inventive concept.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an exemplary embodiment of the inventive concept.

Referring to FIG. 4, the memory cell array 221 according to an exemplary embodiment includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an exemplary embodiment of the inventive concept. FIG. 5 illustrates an example of one of the memory blocks BLK1 to BLKz in the memory cell array 221 of FIG. 4.

The memory block BLKi may include a plurality of cell strings CS11 to CS41 and CS12 to CS42. The plurality of cell strings CS11 to CS41 and CS12 to CS42 may be arranged in column and row directions to form columns and rows. Each of the cell strings CS11 to CS41 and CS12 to CS42 may include a ground select transistor GST, memory cells MC1 to MC6, and a string select transistor SST. The ground select transistor GST, the memory cells MC1 to MC6, and the string select transistor SST, which are included in each of the cell strings CS11 to CS41 and CS12 to CS42, may be stacked in a height direction substantially perpendicular to a substrate.

The columns of the plurality of cell strings CS11 to CS41 and CS12 to CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11 to CS41 and CS12 to CS42 may be connected to different bit lines BL1 and BL2, respectively. For example, the string select transistors SST of the cell strings CS11 to CS41 may be commonly connected to the bit line BL1. The string select transistors SST of the cell strings CS12 to CS42 may be commonly connected to the bit line BL2.

The columns of the plurality of cell strings CS11 to CS41 and CS12 to CS42 may be connected to different ground select lines GSL1 to GSL4, respectively. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The memory cells disposed at the same height from the substrate (or the ground select transistors GST) may be commonly connected to a single word line, and the memory cells disposed at different heights from the substrate may be connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6. The ground select transistors GST of the cell strings CS11 to CS41 and CS12 to CS42 may be commonly connected to the common source line CSL.

The determination of the level assignments will now be discussed in more detail with respect to FIGS. 6-11.

Figure 6:
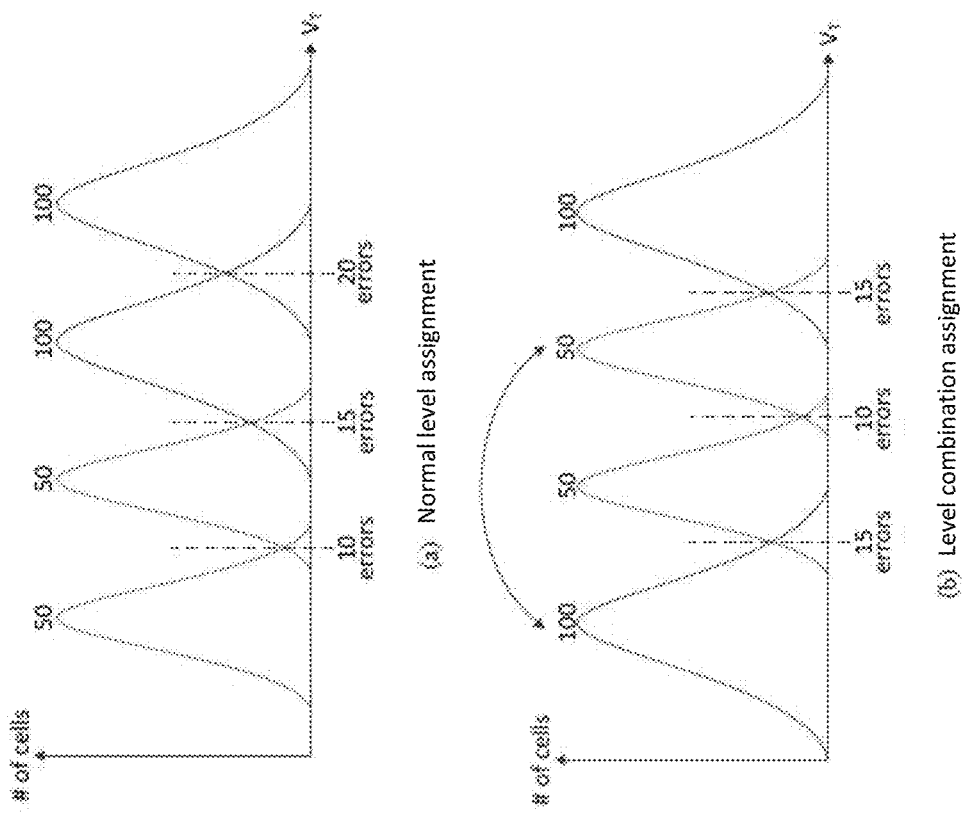
FIG. 6 illustrates exemplary memory cell level distributions based on different level assignments.

Part a of FIG. 6 shows a memory cell distribution when memory cells store 2-bit data if data having a certain configuration of bits for a page is written to the memory device 200 using a normal level assignment. In this example, the data of a page will occupy 300 memory cells of the memory device, where a first 50 of the memory cells would have the erase level, a next 50 of the memory cells would have the first program level, a next first 100 of the memory cells would have the second program level, and a next second 100 of the memory cells would have the third program level.

Since the cells counts of the erase level and the first program level is low, their margin is large, and therefore they account for fewer errors with 10 errors between the erase level and the first program level. On the other hand, the second and third program adjacent levels have a relatively high cell count of 100, which makes their distribution wider number, and leads to higher error rates. For example, part a of FIG. 6 shows thin and thick distributions of 15 errors between the first and second program levels, and thick distributions of 20 errors between the second and program levels. Thus, the level assignment of part a of FIG. 6 results in 45 errors.

With respect to part b of FIG. 6, prior to programming (or writing) a page of date, the level distributions are permutated so that the erased level and second program level switch places since these levels have the two highest cell counts. The three read margins are now wider, since two of them are between thick and thin distributions (the erase level and the first program level, the second and third program levels) to result in 15 errors, and one more has two thin distributions (first and second program levels) to result in 10 errors. Thus, the new or compensated level assignment results in 40 overall errors or a reduction of 5 errors from the normal level assignment.

The proposed technique may be used to balance the error rate among stored sectors, thereby mitigating the worst-case scenario. In 4-levels, two sectors are stored such that one is sensed between the first and second levels, and the second sector is sensed with two sensing operations: between the erase level and the first program level, and between the second and third program levels. In an exemplary embodiment, the levels are permutated such that the number of errors in the two-sensing sector is reduced (thin distributions on the edges) at the expense that the number of errors in the fast single-sensing sector is increased (two thick distributions at the second and third program levels). The implementation of level permutation can be performed without redundancy, by only changing the sectors order and corresponding flash translation layer (FTL) logical-to-physical links (or mapping). In one example, use of the level permutation technique shows a 6.5% error reduction.

In a multi-level-cell (MLC) having 4-levels or 2 bits, there are 6 overlap areas beyond the threshold. Each 4-level MLC includes a least significant bit (LSB) and a most significant bit (MSB). The LSB page may be read by a single reference sensing between the first and second program levels. Error reduction can be achieved in 4-level MLCs if the two levels with the highest number of cells (or high cell counts) is replaced with edge distributions of 0 and 3. For example, the two levels with the highest cell counts are moved as far away from each other as possible. The possible high cell-count pairs are {0, 1} (e.g., erase level and first program level have highest cell counts), {0,2} (e.g., erase level and second program level have highest cell counts), {0,3} (e.g., erase level and third program level have highest cell counts), {1,2} (e.g., erase level and second program level have highest cell counts), {1,3} (e.g., first program level and third program level have highest cell counts), and {2, 3} (e.g., second program level and third program level have highest cell counts).

FIG. 7A illustrates an algorithm for determining a level assignment according to an exemplary embodiment of the inventive concept. FIG. 7B illustrates a method of programming data for 4-level MLCs according to an exemplary embodiment of the inventive concept, which was derived from the algorithm of FIG. 7A. The method of FIG. 7B includes determining cell counts of memory cells in a page of the memory device for each of a plurality of available memory cell levels (S700). For example, for 4-level MLCs, there are 4 available memory cell levels such as level 0 corresponding to an erase level, level 1 corresponding to a first programming level, level 2 corresponding to a second programming level, and level 3 corresponding to a third programming level. Thus, for 4-level MLCs, step S700 results in four cell counts. The level counter 132 under control of the controller core 121 performs a counting to determine the cell counts. In an exemplary embodiment, the counting is performed in response to receipt of a write command and a write address from the Host device 100, where the write address corresponds to a location within the memory device 220. The level counter 132 may include a plurality of counters or counting circuits for counting each of the levels, respectively. In FIG. 7A, the cell counts for each of the levels corresponds to parameters $N_1$, $N_2$, $N_3$, and $N_4$.

The method of FIG. 7B further includes determining the two levels having the highest cell counts using the determined cell counts (step 701). For example, in part a of FIG. 6, the two highest level counts would be level 2 and level 3, for a permutation of {2, 3}. When the two highest counts are considered, it results in 6 possible combinations. Thus, step 701 determines one of six possible combinations such as permutation {0,3} when levels 0 and 3 are highest, permutation {0,1} when levels 0 and 1 are highest, {1, 2} when levels 1 and 2 are highest, permutation {2,3} when levels 2 and 3 are highest, permutation {0,2} when levels 0 and 2 are highest, and permutation {1,3} when levels 1 and 3 are highest. If there is a tie that results in three of the levels being highest, two of the three levels may be chosen randomly as the two highest. In FIG. 7A, the two levels having the highest cell counts corresponds to parameters $M_1$ and $M_2$.

Figure 7:
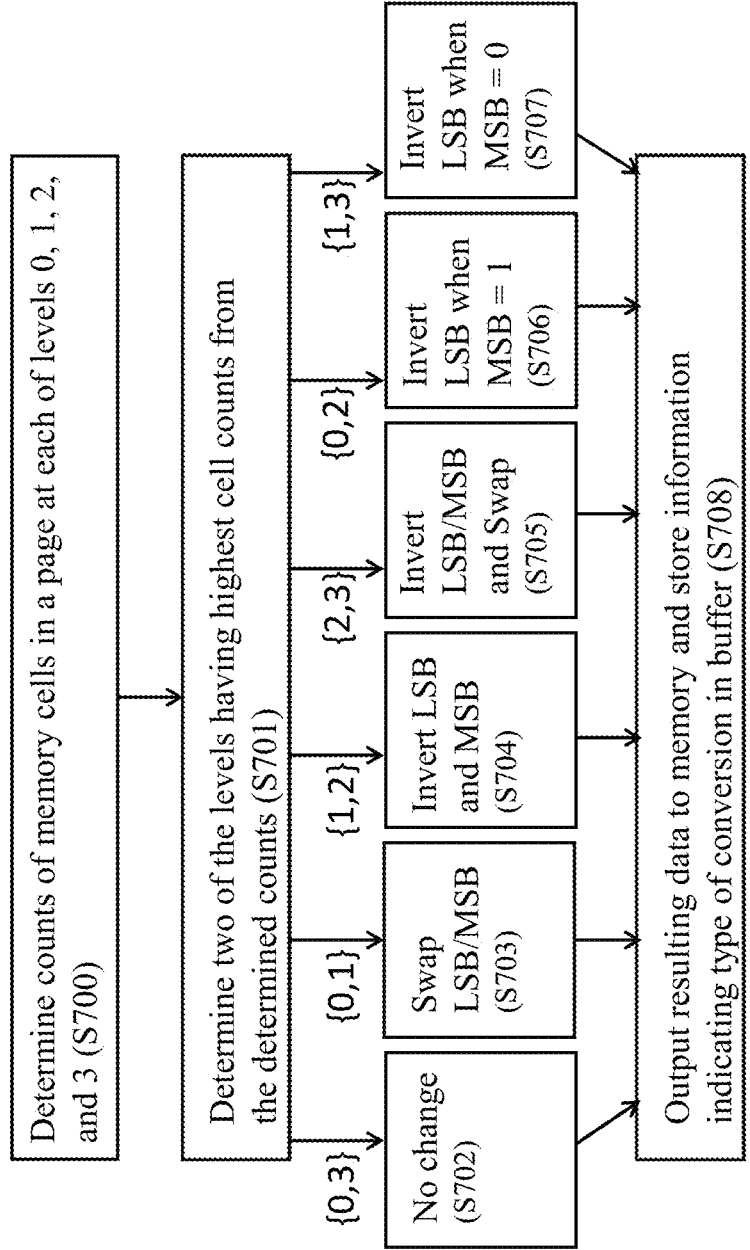
FIG. 7A illustrates a method for assigning memory cell levels when memory cells are 4-level cells according to an exemplary embodiment of the inventive concept.
FIG. 7B illustrates a method of programming data according to the method of FIG. 7A according to an exemplary embodiment of the inventive concept.

The method of FIG. 7 then performs an appropriate conversion based on the determined level permutation.

When the level permutation $\{M_1, M_2\}$ is {0,3}, the method of FIG. 7B includes performing no change on the data (S702).

When the level permutation $\{M_1, M_2\}$ is {0,1}, the method of FIG. 7B includes swapping the least significant bit (LSB) of the data with the most significant bit (MSB) of the data (S703), which corresponds to line 4 of FIG. 7A. For example, if the data is 01010111, then it would be converted into 10101011. In an embodiment, the swapping is performed by switching the physical-to-logical address mapping to a reverse order for the data in the mapping table MT associated with the page of data to be written.

When the level permutation $\{M_1, M_2\}$ is {1,2}, the method of FIG. 7B includes inverting the LSB and the MSB (S704), which corresponds to line 3 of FIG. 7A. For example, if the data is 01010111, then it would be converted into 10101000.

When the level permutation $\{M_1, M_2\}$ is {2,3}, the method of FIG. 7B includes inverting the LSB and the MSB, and swapping the LSB and the MSB (S705), which corresponds to line 6 of FIG. 7A. For example, if the data is 01010111, then it would be converted into 01010100.

When the level permutation $\{M_1, M_2\}$ is {0,2}, the method of FIG. 7B includes inverting the LSB when the MSB=1 (S706), which corresponds to line 7 of FIG. 7A. For example, if the data is 01010111, then it would be converted into 01010110.

When the level permutation $\{M_1, M_2\}$ is {1,3}, the method of FIG. 7B includes inverting the LSB when the MSB=0 (S706), which corresponds to line 8 of FIG. 7A. For example, if the data is 01010111, then it would be converted into 00000011.

Figure 8:
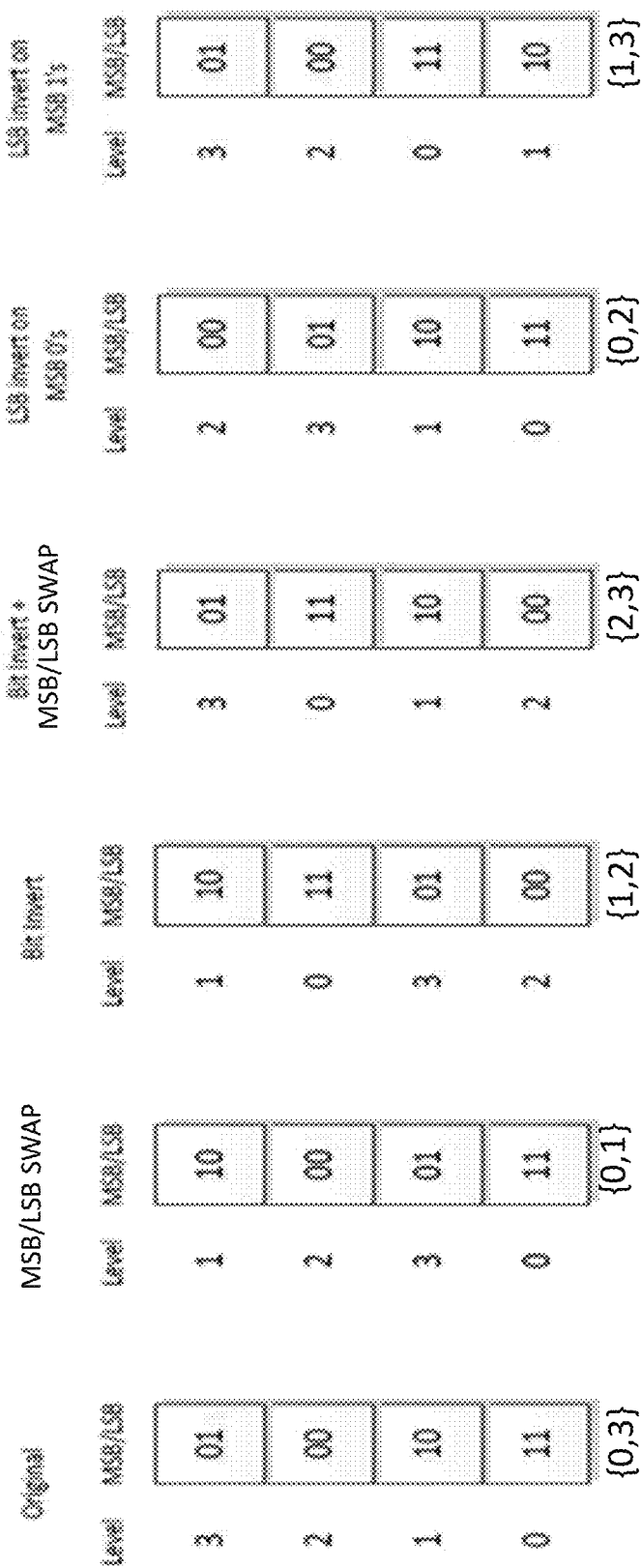
FIG. 8 illustrates exemplary level permutations that may be used in the methods of FIG. 7A or FIG. 7B.

The method of FIG. 7B further includes outputting the resulting data to the memory device and storing information in a memory indicating the type of conversion (S708). For example, if no change was performed, then the data of the page as is would be written to the memory device 220 and the information written to memory 124 would indicate that no conversion took place. The data of the page may be temporarily stored in the page buffer 130 by the controller core 121 before it is written. In another embodiment, the information is written along with the data to the memory device 220. The information may be stored so that it is linked to a logical or physical address of the data. For example, if a change was performed, then the converted data would be stored to the memory device 220 and the information written to memory 124 would indicate the type of conversion that took place. For example, the information could include an index or number that identifies a distinct one of the 6 above-described permutations. FIG. 8 illustrates a normal level assignment (e.g., labelled as Original) and compensated level assignments corresponding to each of the above-described permutations.

Figure 9:
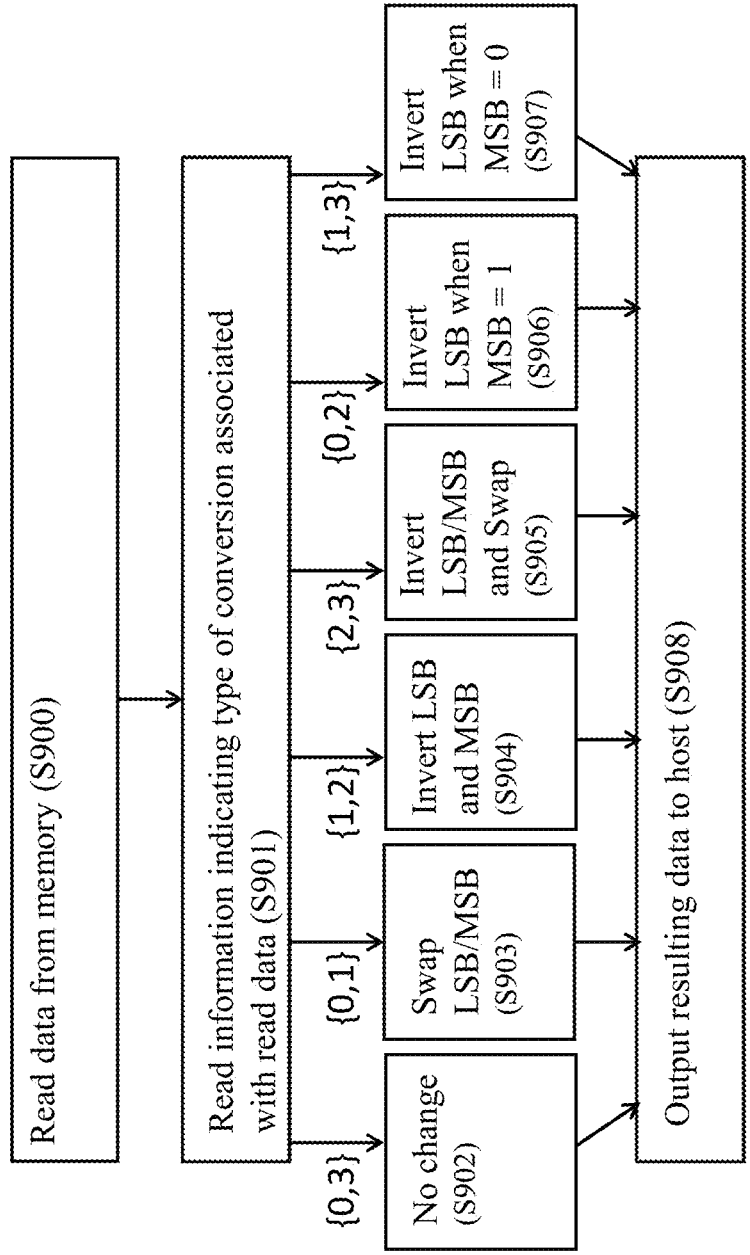
FIG. 9 illustrates a method of reading data that was programmed using the method of FIG. 7B according to an exemplary embodiment of the inventive concept.

FIG. 9 illustrates a method of reading data according to an exemplary embodiment of the inventive concept. The method of FIG. 9 includes reading data from memory (S900). For example, the Host device 100 may send the memory controller 210 a read request including a read command and logical address of the memory device 220, where the data is read from a physical address of the memory device 220 associated with the logical address. For example, the mapping table MT may be accessed using the logical address to retrieve the physical address. The read data may be temporarily stored in the page buffer 130. The read of the data may be performed by the controller core 121.

The method of FIG. 9 further includes reading information indicating the type of conversion associated with the read data (S901). For example, the information may be read from memory 124 or read from the memory device 220. The information may be read by controller core 121.

The method of FIG. 9 further includes converting the read data based on the type of conversion. The type of conversion may indicate a level permutation representing the two highest level counts associated with a page of data.

When the level permutation is {0,3}, the method of FIG. 9 includes performing no change on the data (S902). When the level permutation is {0,1}, the method of FIG. 9 includes swapping the least significant bit (LSB) of the data with the most significant bit (MSB) of the data (S903). When the level permutation is {1,2}, the method of FIG. 9 includes inverting the LSB and the MSB (S904). When the level permutation is {2,3}, the method of FIG. 9 includes inverting the LSB and the MSB, and swapping the LSB and the MSB (S905). When the level permutation is {0,2}, the method of FIG. 9 includes inverting the LSB when the MSB=1 (S906). When the level permutation is {1,3}, the method of FIG. 9 includes inverting the LSB when the MSB=0 (S907).

The method of FIG. 9 further includes outputting the resulting data to the Host (S908). For example, the controller core 121 may output the resulting data to the Host device.

Figure 10:
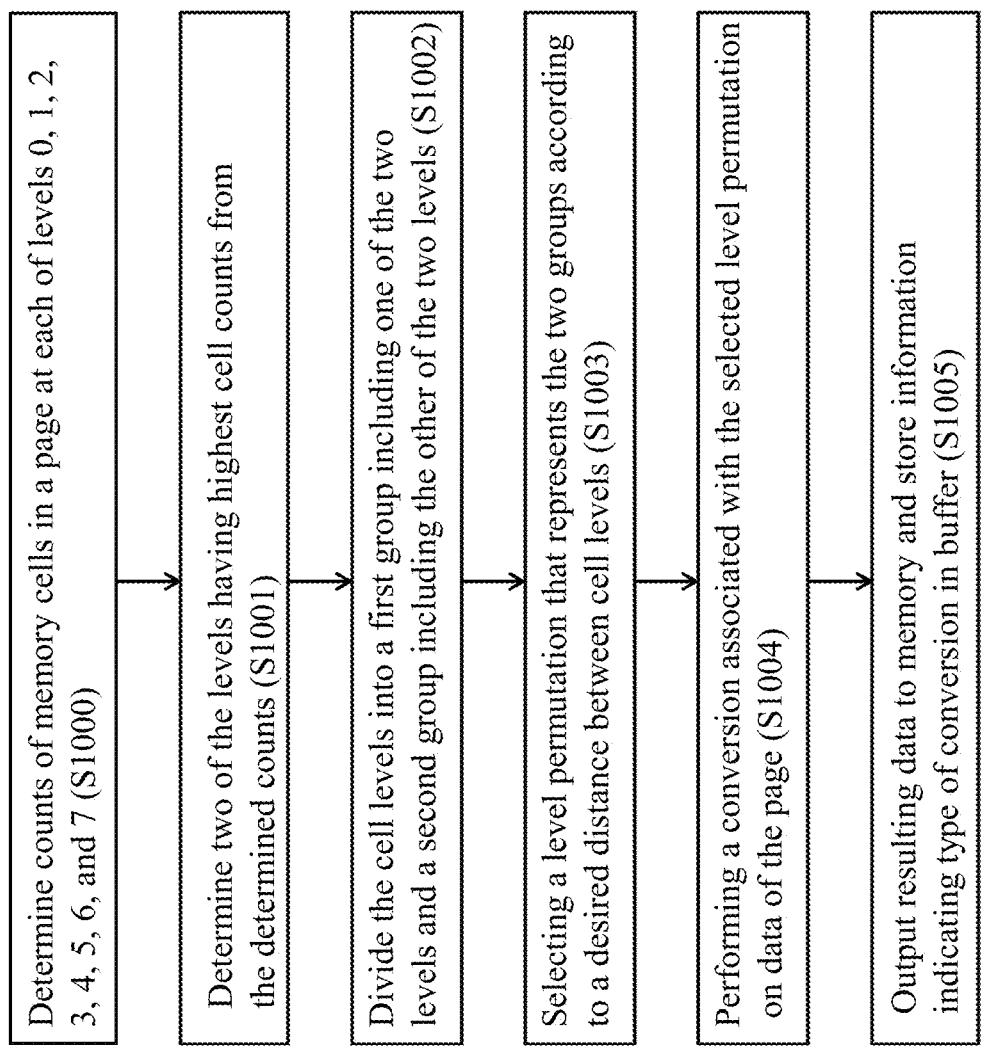
FIG. 10 illustrates a method of programming data when memory cells are 8-level cells according to an exemplary embodiment of the inventive concept.
Figure 11A:
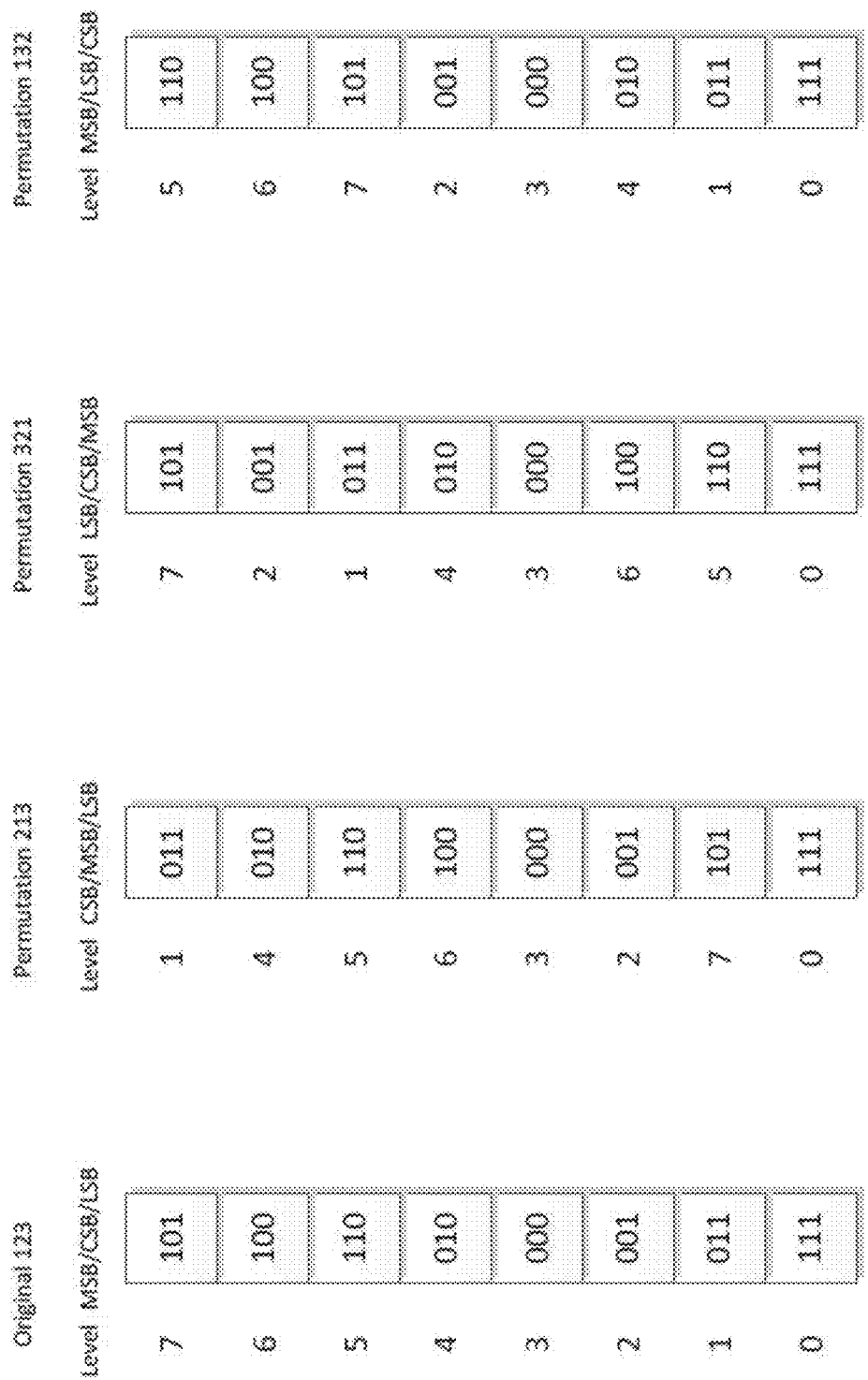
Figure 11B:
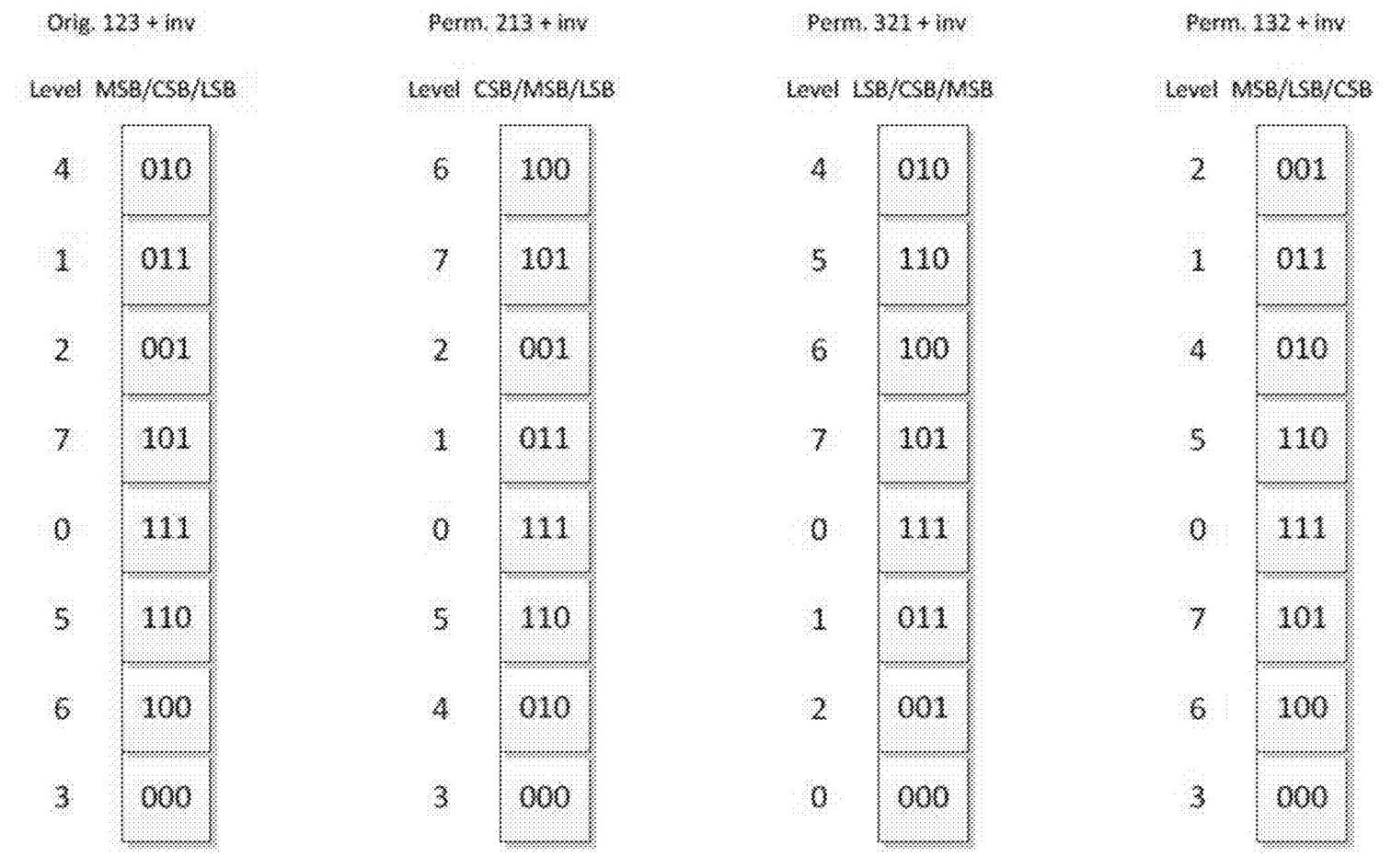

FIG. 10 illustrates a method of programming data for 8-level memory cells according to an exemplary embodiment of the inventive concept. FIGS. 11A and 11B illustrate exemplary level permutations that may be used in the method of FIG. 10.

The method of FIG. 10 includes determining cell counts of memory cells in a page of the memory device for each of a plurality of available memory cell levels (S1000). For example, for 8-level memory cells, there are 16 available memory cell levels such as level 0 corresponding to an erase level, level 1 corresponding to a first program level, level 2 corresponding to a second program level, . . . , through level 15 corresponding to a fifteenth program level. Thus, for 8-level MLCs, step S1000 results in 16 cell counts. The level counter 132 under control of the controller core 121 performs a counting to determine the cell counts. In an exemplary embodiment, the counting is performed in response to receipt of a write command and a write address from the Host, where the write address corresponds to a location within the memory device 220.

The method of FIG. 10 further includes determining two of the cell levels having the highest cell counts from the determined counts (step 1001). For example, all the cell counts may be ordered from highest to lowest, and then the first two in that order represent the two having the highest cell counts.

The method of FIG. 10 further includes dividing the cell levels into a first group including one of the determined two cell levels and a second group including the other of the two cell levels (step 1002). The first group includes three of the remaining cell levels and the second group includes the other three of the remaining cell levels. In an exemplary embodiment, the dividing is done so that cell counts of each of the groups sum to a same value or to a value within a certain range.

The method of FIG. 10 further includes selecting a level permutation from among the available permutations that represents the two groups according to a desired distance between cell levels (step 1003). The selecting may be with respect to a cell-count allocation order. For example, if there are 8 levels, the level permutation could be selected that keeps the two highest cell levels apart by a distance of 6 levels so each of the two highest levels are on the outermost edges in the cell level allocation order. For example, as shown in FIGS. 11A and 11B, if it is determined that levels 0 and 1 have the two highest cell counts, and a first group including cell counts of levels 0, 7, 2, and 3 sums to a value that is the same as or similar (within + or − a certain number of cell counts) to a sum of cell counts of levels 1, 4, 5, and 6, then permutation 213 would be selected. Thus, level 0 would be first in the level allocation order and level 1 would be eighth in the allocation order. If levels 0 and 7 have the two highest cell counts, and a first group including cell counts of levels 0, 1, 2, and 3 sums to a value that is the same as or similar to a sum of cell counts of levels 4, 5, 6, 7, then the original permutation (e.g., labelled in FIG. 11A as Original 123) is selected. However, the distance is not limited to that which keeps the two highest levels furthest apart. For example, if the distance were set to 5, and levels 0 and 1 have the two highest cell counts, a level permutation could be selected that results in level 0 being first in the allocation order and level 1 being seventh in the allocation order.

The method of FIG. 10 further includes performing a conversion associated with the selected permutation on the data (step 1004). As shown in FIGS. 11A and 11B, the conversion associated with permutation Original 123 is no conversion, the conversion associated with permutation Permutation 213 is swapping MSB and the center most significant bit (CSB), the conversion associated with permutation 321 is swapping the LSB and the MSB, the conversion associated with Permutation 132 is swapping the LSB with the CSB, the conversion associated with permutation Original 121+inv is inverting the data, and the conversion associated with Permutation 231+inv is a left shift or rotate left with respect to 2 bits and an invert. Thus, some of the permutations are associated with swapping only two among the three LSB, CSB, and MSB, some are associated with this swapping and an inverting, some are associated with a left or right shift, and some are associated with a shift and invert.

The method of FIG. 10 further includes storing the resulting data in the memory and storing information of the type of conversion in a buffer (step 1005). For example, the resulting data may be stored in the memory device 220 and the information could be stored in memory 124. The data may be later read in a similar manner to that discussed in FIG. 9. For example, upon receiving a request to read the data, the information indicating the type of conversion associated with the read data may be retrieved, and then a conversion corresponding to the type is performed on the read data before outputting it to the Host. For example, if the MSB was swapped with the CSB during the write, then this same swap would be performed during the read. For example, if a left shift of 2 was performed during the write, then a right shift of 2 would be performed during the read. In an exemplary embodiment, instead of the method of FIG. 10 being performed when 8-level MLCs are used, one of the 12 level permutations of FIGS. 11A and 11B with a lowest bit error rate (BER) is chosen when writing the data, the chosen level permutation is stored as information in the memory 128, a conversion is performed on the data associated with the chosen level permutation, and the resulting data is stored to the memory device 220.

Figure 12:
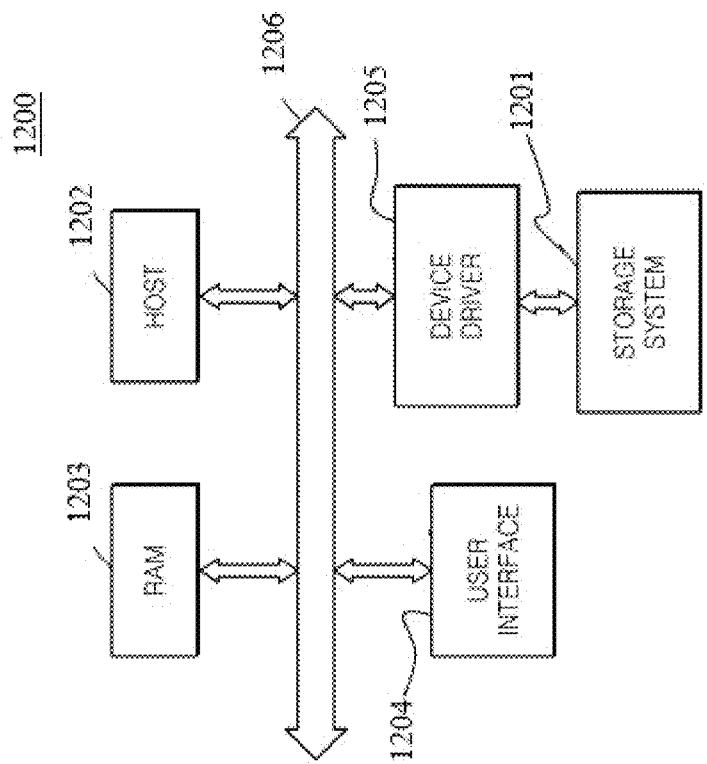
FIG. 12 is a block diagram of a computing system including a non-volatile memory system, according to an exemplary embodiment of the inventive concept.

FIG. 12 is a block diagram of a computing system 1200 including a non-volatile memory system, according to an exemplary embodiment of the inventive concept.

The non-volatile memory system in FIG. 12 may be the memory system 200 illustrated in FIG. 1. In the computing system 1200, which may be, for example, a mobile device or a desktop computer, the non-volatile memory system may be mounted as a non-volatile storage system 1201, however exemplary embodiments are not limited thereto.

The computing system 1200 may include, for example, a host 1202 including a CPU, a RAM 1203, a user interface 1204, and a device driver 1205. The host 1202 may be the host 100 illustrated in FIG. 1, and the device driver 1205 may be the memory device driver 111 illustrated in FIG. 1. These elements are electrically connected to a bus 1206. The non-volatile storage system 1201 may be connected to the device driver 1205. The host 1202 may control the entire computing system 1200 and perform an operation corresponding to a user command input through the user interface 1204. The RAM 1203 may function as a data memory of the host 1202. The host 1202 may write user data to or read user data from the non-volatile storage system 1201 through the device driver 1205. In FIG. 12, the device driver 1205 that controls the operation and management of the non-volatile storage system 1201 is illustrated as being disposed outside the host 1202, however exemplary embodiments are not limited thereto. For example, in an exemplary embodiment, the device driver 1205 may be disposed inside the host 1202.

In exemplary embodiments of the present inventive concept, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In exemplary embodiments of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the exemplary embodiments may be physically separated into two or more interacting and discrete blocks, units and/or modules without departing from the scope of the inventive concept. Further, the blocks, units and/or modules of the exemplary embodiments may be physically combined into more complex blocks, units and/or modules without departing from the scope of the inventive concept.

Exemplary embodiments of the present invention may be embodied directly in hardware, in a software module executed by a processor, or in a combination of the two. A software module may be tangibly embodied on a non-transitory program storage device such as, for example, in RAM memory, flash memory, ROM memory, EPROM memory, EEPROM memory, registers, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an application specific integrated circuit (ASIC).

While the present inventive concept has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A memory system, comprising:
a memory device comprising a plurality of memory cells; and
a memory controller configured to manage the memory device using a cell level assignment with respect to a plurality of memory cell levels, determine a cell count for each of the cell levels associated with original data of the memory device that is to be accessed, predict an error rate from the cell counts, and selectively adjust the cell level assignment based on the error rate,
wherein the memory controller determines two of the levels having a highest cell count from the cell counts, determines one of a plurality of permutations of the cell levels in which the determined two levels are not adjacent to one another, and adjusts the cell level assignment according to the determined permutation.

2. The memory system of claim 1, wherein the two levels are furthest apart from one another in the determined one permutation.

3. The memory system of claim 1, wherein the memory controller performs a conversion on the original data associated with the determined permutation and stores the converted data in the memory device and stores information indicating a type of the conversion.

4. The memory system of claim 3, wherein the conversion swaps a least significant bit (LSB) and a most significant bit (MSB) of the original data when the two levels are an erase level and a first program level adjacent the erase level.

5. The memory system of claim 3, wherein the conversion inverts the original data when the two levels are adjacent program levels.

6. The memory system of claim 3, wherein the conversion inverts a least significant bit (LSB) of the original data when a most significant bit (MSB) of the data is 1 when the two levels are an erase level and a second program level that is adjacent to a first program level between the erase level and the second program level.

7. The memory system of claim 3, wherein the conversion inverts a least significant bit (LSB) of the original data when a most significant bit (MSB) of the original data is 0 when the two levels are a first program level and a third program level that is adjacent to a second program level between the first level and the third program level.

8. The memory system of claim 3, wherein the memory controller reads the converted data upon receiving a request for the original data from a host device, performs a conversion on the converted data according to the information associated with the original data to generate read data, and outputs the read data to the host device.

9. The memory system of claim 1, wherein the memory controller divides the cell levels into a first group including one of the two levels and a second group including the other of the two levels, and determines the permutation that represents the groups according to a desired distance between the cell levels.

10. The memory system of claim 9, where a sum of cell counts of each of the groups is the same.

11. The memory system of claim 3, further comprising a buffer storing the information.

12. A computer-implemented method for programming data to a memory system comprising a memory device and a memory controller, the method comprising:
receiving, by the memory controller, a write request including write data;
determining, by the memory controller, cell counts of each of a plurality of cell levels based on the write data;
determining, by the memory controller, two of the cell levels having a highest cell count from the determined cell counts;
determining, by the memory controller, one of a plurality of permutations of the cell levels that has a lowest error rate in which the determined two cell levels are not adjacent to one another;
adjusting, a cell level assignment of the memory device to the determined one permutation; and
writing, by the memory controller, the write data to the memory device using the adjusted cell level assignment according to the determined one permutation.

13. The method of claim 12, wherein the two levels are furthest apart from one another within the determined one permutation.

14. The method of claim 12, wherein the writing includes converting the write data according to a conversion associated with the determined one permutation, writing the converted data to the memory device, and storing information associated with the converted data indicating a type of the conversion.

15. The method of claim 12, wherein the converting includes at least one of i) swapping a least significant bit (LSB) and a most significant bit of the write data, ii) inverting the write data, or iii) shifting the write data.

16. A computer-implemented method for reading data from a memory system comprising a memory device and a memory controller, the method comprising:

receiving, by the memory controller, a read request including a read address from a host device;

reading, by the memory controller, information associated with the read address indicating one of a plurality of permutations of memory cell levels;

reading, by the memory controller, read data from the memory device corresponding to the read address using the indicated permutation, wherein two memory levels having a highest cell count of the memory cell levels are not adjacent to one another in the indicated permutation; and outputting, by the memory controller, the read data to the host device.

17. The method of claim 16, wherein the indicated permutation is associated with a conversion operation that is performed on the read data before being output to the host device.

18. The method of claim 16, wherein the conversion operation includes performing at least one of i) swapping a least significant bit (LSB) and a most significant bit of the read data, ii) inverting the read data, or iii) shifting the read data.

* * * * *